(12) United States Patent
Wang et al.

(10) Patent No.: US 10,522,565 B2
(45) Date of Patent: Dec. 31, 2019

(54) ARRAY SUBSTRATE, DISPLAY PANEL AND MANUFACTURING METHOD THEREOF

(71) Applicant: Wuhan China Star Optoelectronics Technology Co., Ltd., Wuhan, Hubei (CN)

(72) Inventors: Chuan Wang, Guangdong (CN); Meng Zhou, Guangdong (CN); Xiaojiang Yu, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 36 days.

(21) Appl. No.: 16/044,974

(22) Filed: Jul. 25, 2018

(65) Prior Publication Data

US 2019/0267405 A1    Aug. 29, 2019

Related U.S. Application Data

(63) Continuation of application No. PCT/CN2018/084780, filed on Apr. 27, 2018.

(30) Foreign Application Priority Data

Feb. 28, 2018  (CN) .......................... 2018 1 0166231

(51) Int. Cl.
| | | |
|---|---|---|
| *H01L 27/12* | (2006.01) | |
| *H01L 23/538* | (2006.01) | |
| *G06F 3/041* | (2006.01) | |

(52) U.S. Cl.
CPC ........ *H01L 27/1222* (2013.01); *G06F 3/0412* (2013.01); *H01L 23/5384* (2013.01);
(Continued)

(58) Field of Classification Search
CPC ... H01L 27/124; H01L 27/055; G06F 3/0412; G06F 3/044; G06F 2203/04107; G02F 1/136204
See application file for complete search history.

(56) References Cited

U.S. PATENT DOCUMENTS

| | | | |
|---|---|---|---|
| 2013/0341651 A1 | 12/2013 | Kim | |
| 2015/0049263 A1* | 2/2015 | Chu | ........................ G06F 3/041 349/12 |
| 2016/0149401 A1* | 5/2016 | Chen | ..................... H02H 9/044 361/56 |

FOREIGN PATENT DOCUMENTS

| | | |
|---|---|---|
| CN | 101158790 A | 4/2008 |
| CN | 103902092 A | 7/2014 |

(Continued)

OTHER PUBLICATIONS

International search report dated Nov. 21, 2018 from corresponding application No. PCT/CN2018/084780.

*Primary Examiner* — Charles D Garber
*Assistant Examiner* — Alia Sabur
(74) *Attorney, Agent, or Firm* — Leong C. Lei (57) ABSTRACT

An array substrate provided comprises a gate insulating layer, touch control element and first conducting wire disposed on a substrate; insulating interlayer covering gate insulating layer, touch control element and first conducting wire; protective wire arranged along the surface periphery of insulating interlayer; planarization layer covering insulating interlayer and protective wire, and second conducting wire disposed on surface of planarization layer; wherein touch control element is insulated from first conducting wire comprising an extension section, and free end of extension section is a first end; protective wire is electrically connected with first end; second conducting wire comprises a second and third end arranged oppositely and a contact position (Continued)

between second and third end; second end is electrically connected with touch control element, and contact position is electrically connected with a portion of first conducting wire inner substrate. A display panel and manufacturing method thereof are further provided.

17 Claims, 4 Drawing Sheets

(52) U.S. Cl.
CPC ........ *H01L 27/124* (2013.01); *H01L 27/1248* (2013.01); *H01L 27/1262* (2013.01)

(56) References Cited

FOREIGN PATENT DOCUMENTS

| | | |
|---|---|---|
| CN | 104375689 A | 2/2015 |
| CN | 104423081 A | 3/2015 |
| EP | 0545712 A1 | 6/1993 |

* cited by examiner

ARRAY SUBSTRATE, DISPLAY PANEL AND MANUFACTURING METHOD THEREOF

RELATED APPLICATION

The present application is a continuation application of PCT Patent Application No. PCT/CN2018/084780 filed on Apr. 27, 2018, which claims the priority benefit of Chinese Patent Application No. 201810166231.8, entitled "array substrate, display panel and manufacturing method thereof", filed on Feb. 28, 2018, which is herein incorporated by reference in its entirety.

FIELD OF THE INVENTION

The present disclosure relates to a display field, in particular to an array substrate, a display panel and a manufacturing method thereof.

BACKGROUND OF THE INVENTION

As a sophisticated semiconductor product, the performance of TFT-LCD (thin film transistor liquid crystal display) is always threatened by static electricity in the environment during the manufacturing process. The main source of static electricity is friction and contact between the product and platform mechanism, and contact between human body and the product, and the like. Once static electricity enters the circuit of a TFT-LCD product, it may cause electrostatic explosion, damage electronic elements, lead poor display, and reduce the yield. Therefore, it is very important to improve the antistatic ability of TFT-LCD.

Figure 1:
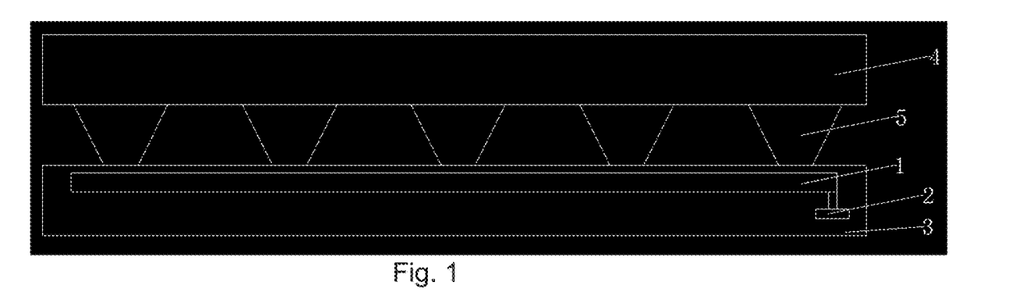
FIG. 1 is a schematic diagram illustrating the alignment between the array substrate and the color film substrate in prior manufacturing process of a display panel.

As shown in FIG. 1, in alignment process of TFT-LCD substrate (3) and CF substrate (4), TFT substrate may rub against photoresist spacers (5) on the CF substrate, resulting in the generation of static electricity in the panel. Metal wire (1) connected with a touch control element (2) may conduct static electricity to the touch control element (2) made of polysilicon, which causes explosion of the touch control element and a bad touch, thus affecting the performance of the screen and reducing the yield.

SUMMARY OF THE INVENTION

The object of the present disclosure is to provide an array substrate, which can protect touch control elements in a display panel and prevent the failure of them due to electrostatic explosion during the manufacturing process of the display panel.

The present disclosure further provides a display panel and a manufacturing method thereof.

The array substrate of the present disclosure comprises:
a substrate;
a gate insulating layer, a touch control element and a first conducting wire disposed on the substrate; wherein the touch control element is insulated from the first conducting wire; the first conducting wire comprises an extension section extending beyond the substrate, and the free end of the extension section is a first end;
an insulating interlayer covering the gate insulating layer, the touch control element and the first conducting wire, and a protective wire arranged along the surface periphery of the insulating interlayer; wherein the protective wire is electrically connected with the first end through a via-hole penetrating the insulating interlayer;
a planarization layer covering the insulating interlayer and the protective wire, and a second conducting wire disposed on the surface of the planarization layer; wherein the second conducting wire comprises a second end and a third end arranged oppositely and a contact position between the second end and the third end; the second end is electrically connected with the touch control element through a via-hole, and the contact position is electrically connected with a portion of the first conducting wire located in the substrate through a via-hole.

The second conducting wire disclosed herein may comprise a first portion arranged around a portion of the touch control element, and the second end is a free end of the first portion.

The contact position disclosed herein may be located in the first portion and the first portion is electrically connected with the first conducting wire in the substrate after going around to a side of the touch control element.

The first conducting wire disclosed herein may comprise a second portion arranged around a portion of the touch control element, and the second portion is electrically connected with the contact position of the second conducting wire after going around to a side of the touch control element.

The protective wire disclosed herein may be enclosed along the surface periphery of the insulating interlayer to form a protective area; a portion of the first conducting wire, the touch control element and the second conducting wire are located in the protective area; and the extension section of the first conducting wire extends beyond the protective area.

The protective area disclosed herein may be provided with a chip attaching area used to attach chips, and the chips are electrically connected with the third end of the second conducting wire.

The second conducting wire and the touch control element disclosed herein may be made of polysilicon.

The touch control element disclosed herein may comprise a source and a drain; the source and the drain are disposed in the same layer with the protective wire and are insulated from the protective wire.

The manufacturing method of a display panel in the present disclosure comprises:
providing an array substrate as described above and a color film substrate;
aligning the array substrate with the color film substrate;
cutting the array substrate along the periphery of the substrate and removing the extension section of the first conducting wire extending beyond the substrate to obtain a display panel.

The display panel of the present disclosure disclosed herein may comprise a color film substrate and the array substrate as described above, wherein the first conducting wire is insulated from second conducting wire.

The connection relation between the first conducting wire and the touch control element is changed in the array substrate of the present disclosure, and the first conducting wire is connected with the second conducting wire before it is connected with the touch control element. When static electricity is generated during the manufacturing process of a display panel, static electricity can be directly conducted to the protective wire by the first conducting wire through the second conducting wire, thereby preventing prevent the touch control element from blowing up because of receiving the static electricity.

BRIEF DESCRIPTION OF THE DRAWINGS

In order to illustrate implementations of present disclosure or the technical solutions of other implementations more clearly, the drawings according to the implementations of present disclosure or the drawings according to the other implementations will be introduced briefly. Apparently, hereinafter described drawings are merely a portion of implementations of present disclosure. For those skilled in the art, they can obtain other drawings on the base of these drawings without creative work.

DETAILED DESCRIPTION OF THE INVENTION

Hereinafter, a clear and complete description of the technical solutions in the implementations of the present disclosure will be illustrated, which combined with the drawings in the implementations of the present disclosure. Apparently, described implementations are merely a portion of implementations of present disclosure, rather than all of the implementations. Base on the implementations of present disclosure, all other implementations obtained by those skilled in the art without creative work are considered to be encompassed within the scope of the present disclosure.

Figure 2:
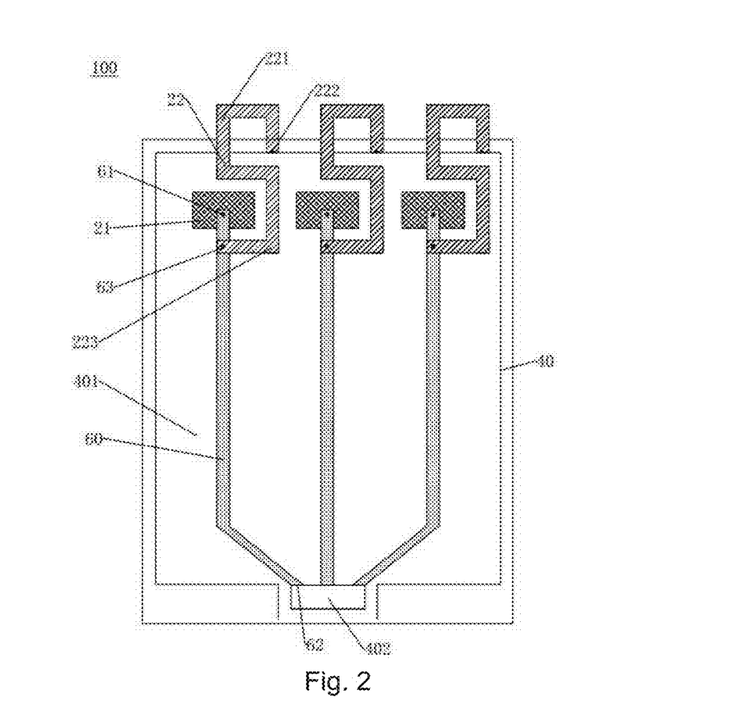
FIG. 2 is a planar wiring diagram of the array substrate provided by a first implementation of the present disclosure.
Figure 3:
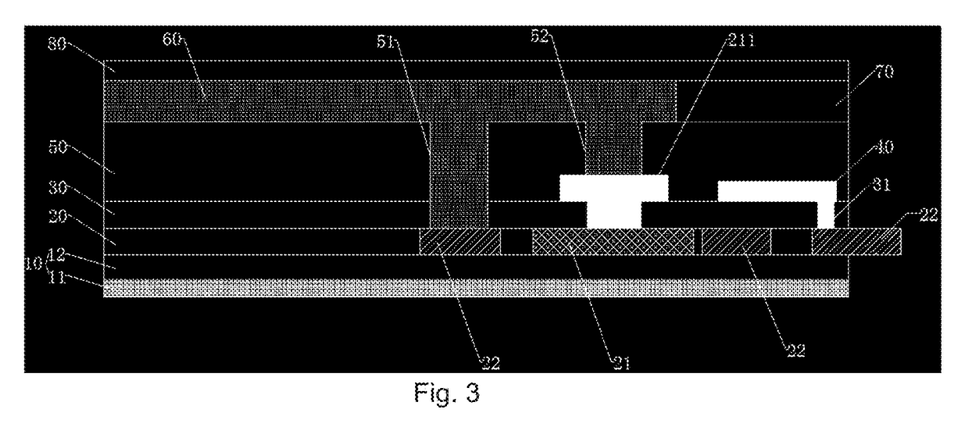
FIG. 3 is a stereoscopic wiring diagram of the array substrate of FIG. 2.

See FIG. 2 and FIG. 3. The present disclosure provides an array substrate for manufacturing a display panel, which can effectively prevent the array substrate from being damaged by static electricity during the manufacturing process of the display panel. The array substrate of the present disclosure comprises a substrate 10, a gate insulating layer 20, a touch control element 21 and a first conducting wire 22 disposed on the substrate 10, an insulating interlayer 30 covering the gate insulating layer 20, the touch control element 21 and the first conducting wire 22, and a protective wire 40 arranged along the surface periphery of the insulating interlayer 30, a planarization layer 50 covering the insulating interlayer 30 and the protective wire 40, and a second conducting wire 60 disposed on the surface of the planarization layer 50. Herein, the touch control element 21 is insulated from the first conducting wire 22, the first conducting wire 22 comprises an extension section 221 extending beyond the substrate 10, and the free end of the extension section 221 is a first end 222. The protective wire 40 is electrically connected with the first end 222 through a via-hole penetrating the insulating interlayer 30. The second conducting wire 60 comprises a second end 61 and a third end 62 arranged oppositely and a contact position 63 between the second end 61 and the third end 62, the second end 61 is electrically connected with the touch control element 21 through a via-hole, and the contact position 63 is electrically connected with a portion of the first conducting wire 22 located in the substrate 10 through a via-hole. In this implementation, the touch control element 21 is made of polysilicon, which is easily damaged by electrostatic explosion.

In the manufacturing process of a display panel, the first conducting wire in the array substrate of the present disclosure can conduct static electricity to the second conducting wire before it is conducted to the touch control element, and the static electricity can be directly conducted onto the protective wire through the second conducting wire, thereby preventing effectively the touch control element from being damaged by electrostatic explosion in the manufacturing process of a display panel.

Further, the gate insulating layer 20, the touch control element 21 and the first conducting wire 22 are disposed on the substrate 10 and disposed in the same layer. Specifically, a first via-hole 31 is disposed in the insulating interlayer 30 and penetrates the insulating interlayer 30. The protective wire 40 disposed on the insulating interlayer 30 is enclosed along the surface periphery of the insulating interlayer 30 to form a protective area 401, the portion of the first conducting wire 22, the touch control element 21 and the second conducting wire 60 are located in the protective area 401, the extension section 221 of the first conducting wire 22 extends beyond the protective area 401, and the protective wire 40 is electrically connected with the first end 222 of the first conducting wire 22 through a first via-hole 31. Specifically, the first conducting wire 22 is made of highly doped polysilicon material. When the static electricity generated in the external environment of the array substrate 100 passes through the extension section 221 of the first conducting wire 22, the polysilicon material will be burned out by electrostatic explosion, thereby blocking the static electricity in the external environment into the array substrate 100, and preventing the touch control element 21 in the array substrate 100 from being damaged by the static electricity in the external environment. The extension section 221 of the first conducting wire 22 will be removed when the process of the display panel is finished so that the electrical connection between the first conducting wire 22 and the protective wire 40 is disconnected to ensure normal display of the display panel. In the present disclosure, the substrate 10 comprises a substrate body 11 and a buffer layer 12 stacked on the substrate body 11. The substrate body 11 is a glass substrate, and the periphery of the substrate 10 represents the cutting line of the glass substrate. That is to say, the cutting line of the extension section 221 of the first conducting wire 22 extends beyond the glass substrate. After the process of the display panel is finished, the display panel is cut into a plurality of display screens along the cutting line of the glass substrate while the extension section 221 of the first conducting wire 22 is removed, which ensures the normal display of the display screen. Understandably, the substrate body 11 is not limited to a glass substrate in other implementations.

The protective area 401 is provided with a chip attaching area 402, chips of the array substrate are attached to the chip attaching area 402, the chips are electrically connected with the third end 62 of the second conducting wire 60, and the second conducting wire 60 transmits the touch signal sent by the chips to the touch control element 21. The touch control element 21 comprises a source and a drain 211, and the source and the drain 211 are disposed in the same layer with the protective wire 40 and are insulated from the protective wire 40. That is to say, the source and the drain 211 is disposed on the surface of the insulating interlayer 30, and the second end 61 of the second conducting wire 60 is electrically connected with the touch control element 21 through the source and the drain 211. The second conducting wire 60 is disposed on the surface of the planarization layer 50, and the planarization layer 50 is provided with a second via-hole 51 and a third via-hole 52, the second via-hole 51 penetrates the planarization layer 50, the third via-hole 52 penetrates the planarization layer 50 and insulating interlayer 30, the second end 61 of the second conducting wire 60 is electrically connected with the touch control element 21 through the second via-hole 51, and the contact position 63 of the second conducting wire 60 is electrically connected with the first conducting wire 22 located in the substrate 10 through a third via-hole 52.

In the present disclosure, there are various wiring ways of the first conducting wire 22, the touch control element 21 and the second conducting wire 60, so long as the connection point of the first conducting wire 22 and the second conducting wire 60 is in front of the connection point that the second conducting wire 60 is connected to the touch control element 21, and the effect of electrostatic protection can be achieved. See FIG. 2 and FIG. 3 again. In a first implementation of the array substrate of the present disclosure, the first conducting wire 22 comprises a second portion 223 arranged around a portion of the touch control element 21, and the second portion is electrically connected with the contact position 63 of the second conducting wire 60 after going around to a side of the touch control element 21. In this implementation, after the second portion 223 going around from the top of the touch control element 21 to the bottom, the first conducting wire 22 is electrically connected with the contact position 63 of the second conducting wire 60. In general, the contact position 63 can be located at any position between the second end 61 and the third end 62 of the second conducting wire 60. The closer the contact position 63 is to the second end 61, the more static electricity in the second conducting wire 60 can be conducted onto the protective wire 30 by the first conducting wire 22 when static electricity is generated in the manufacturing process of a display panel, and the better the electrostatic protection effect is on the touch element 21, and the smaller probability that the touch control element 21 will be damaged by electrostatic explosion is. In a preferred implementation, the contact position 63 is in front of the connection point that the second conducting wire 60 will be connected to the touch control element 21, which can ensure that the touch control element 21 will not be damaged by electrostatic explosion as far as possible. In this implementation, the wiring of the first conducting wire 22 is in an 8-shaped configuration, which makes that the wiring of the first conducting wire 22 is more cumbersome and the manufacturing process is more complicated.

Figure 4:
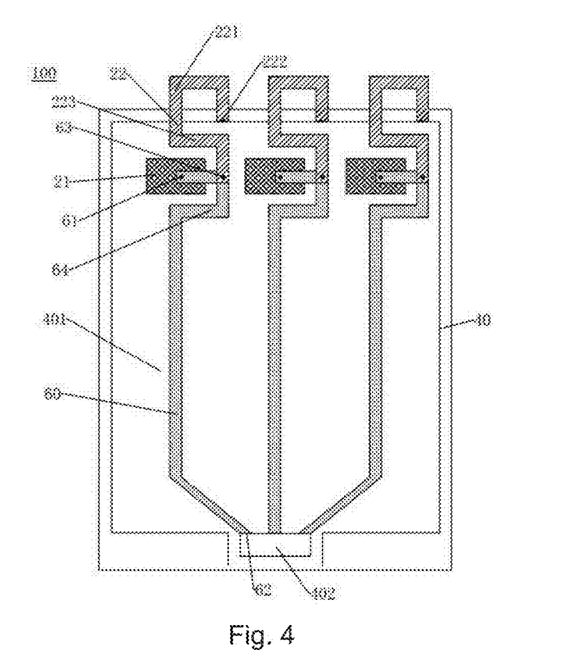
FIG. 4 is a planar wiring diagram of the array substrate provided by a second implementation of the present disclosure.

See FIG. 4. In a second implementation of the array substrate of the present disclosure, the difference from the above implementation is that the second conducting wire 60 comprises a first portion 64 arranged around a portion of the touch control element 21, and the second end 61 is a free end of the first portion 64. In this implementation, the first portion 64 goes around from the bottom of the touch control element 21 to the side, and the second portion 223 of the first conducting wire 22 goes around from the top of the touch control element 21 to the side. Optionally, the contact position 63 is located in the first portion 64, and the second portion 223 is first electrically connected with the first portion 64 through the contact position 63 after the second portion 223 going around from the top of the touch control element 21 to the side, and then electrically connected with the touch control element 21 through the second end 61. When static electricity is generated in the manufacturing process of a display panel, the static electricity can be directly conducted onto the protective wire 30 by the second conducting wire 60 through the first conducting wire 22, thereby preventing the touch control element 21 from being damaged by electrostatic explosion. The first portion 64 of the second conducting wire 60 and the second portion 223 of the first conducting wire 22 surround the touch control element 21 together and the wiring of wires inside the array substrate 100 is simpler compared with above implementation.

Figure 5:
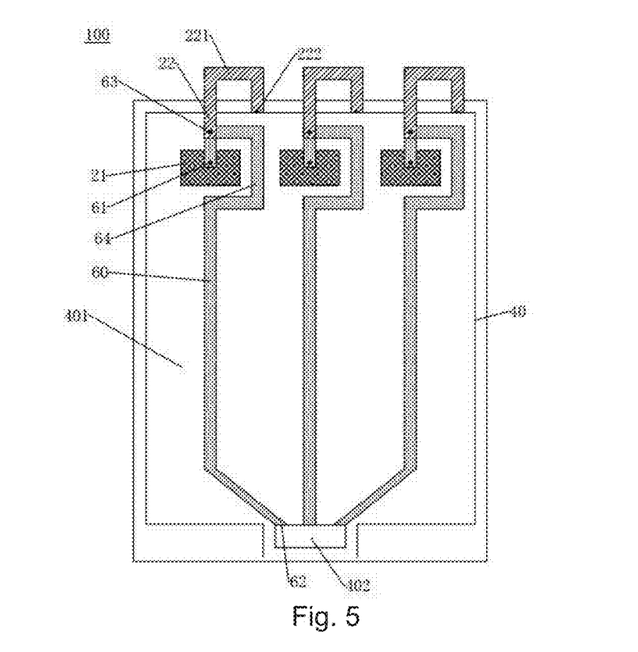
FIG. 5 is a planar wiring diagram of the array substrate provided by a third implementation of the present disclosure.
Figure 6:
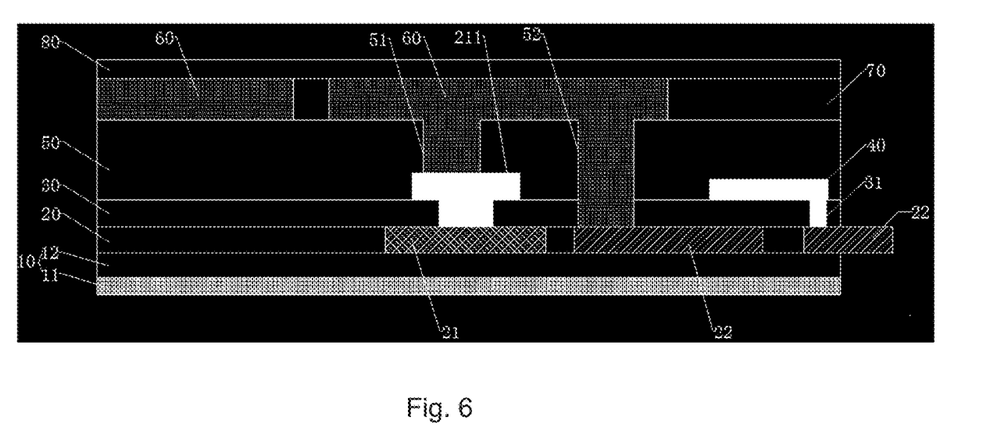
FIG. 6 is a stereoscopic wiring diagram of the array substrate of FIG. 5.

See FIG. 5 and FIG. 6. In a third implementation provided by the present disclosure, the difference from the two implementations above is that the first portion 64 of the second conducting wire 60 goes around from the bottom of the touch control element 21 to the top and is first electrically connected with the second end 222 through the contact position 63 and then electrically connected with the touch control element 21 through the second end 61. When static electricity is generated in the manufacturing process of a display panel, the static electricity can be directly conducted onto the protective wire 30 by the second conducting wire 60 through the first conducting wire 22, thereby preventing the touch control element 21 from being damaged by electrostatic explosion. The wiring of wires inside the array substrate 100 is simpler compared with the two implementations above.

In the present disclosure, the array substrate 100 further comprises an insulating isolation layer 70 and an insulating protection layer 80, the insulating isolation layer 70 herein is disposed on the surface of the planarization layer 50 and is in the same layer with the second conducting wire 60, and the second conducting wire 60 and the insulating isolation layer 70 are covered by the insulating protection layer 80.

Figure 7:
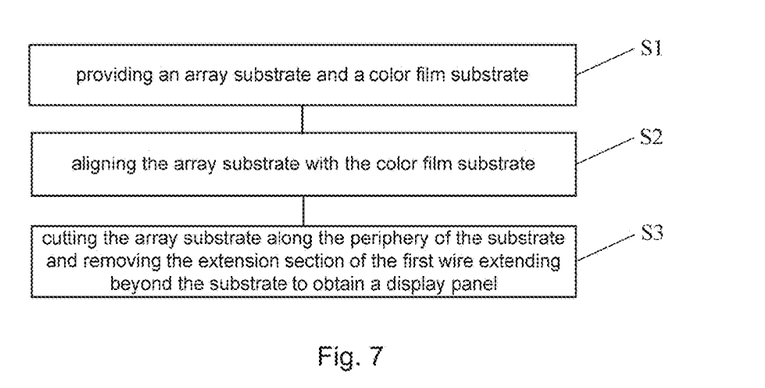
FIG. 7 is a flow diagram illustrating the manufacturing method of the display panel of the present disclosure.

The present disclosure further provides a manufacturing method of a display panel to prevent the damage of the touch control element caused by static electricity during the manufacturing process of a display panel, and improve the yield of the display panel. The manufacturing method of the display panel comprises following steps of S1, S2 and S3.

At S1, an array substrate and a color film substrate are provided. The array substrate disclosed herein is one of foregoing array substrates, and the surface of the color film substrate is provided with a plurality of photoresist spacers sequentially disposed at uniform intervals.

At S2, the array substrate is aligned with the color film substrate. Specifically, the array substrate is placed on the photoresist spacers to achieve accurate alignment of the array substrate with the color film substrate. When static electricity is generated by friction between the array substrate and the color film substrate, the static electricity can be directly conducted onto the protective wire by the first conducting wire in the array substrate through the second conducting wire, thus the static electricity being conducted from the panel and protecting the touch control element.

At S3, the array substrate is cut along the periphery of the substrate and the extension section of the first conducting wire extending beyond the substrate is removed to obtain a display panel. The periphery of the substrate disclosed herein is the cutting line and the display panel can be cut into a plurality of display screens along the cutting line of the substrate after alignment of the array substrate with the color film substrate. In the cutting process, the extension section of the first conducting wire will also be removed so that the first conducting wire and the touch control element are disconnected to ensure normal walk of the display screen.

The present disclosure further provides a display panel comprising a color film substrate and an array substrate 100 as described above, and the first conducting wire 22 and second conducting wire 60 in the array substrate 100 herein are insulating from each other. That is to say, the extension section of the first conducting wire is removed along the periphery of the substrate 10, so that the first conducting wire 22 and the touch control element 21 are disconnected to ensure normal walk of the display panel.

What needs to be explained herein is as follows.

Only wiring ways between a single first conducting wire, a single second conducting wire and a single touch control element are illustrated in the specification and claim of the application, and the first conducting wire, the second conducting wire and the touch control element in the array substrate described in the application actually are all multiple, wiring ways of each first conducting wire, second conducting wire and touch control element can be at least one of wiring ways of the array substrate in above implementations.

The above disclosure is merely preferred implementations of the present disclosure, but the disclosure is not to be construed as being limited thereto. Those skilled in the art can understand all or a portion of the process of implementing the above implementations and equivalent changes made to the implementations in accordance with the claim of the present disclosure shall be covered within the scope of the present disclosure.

What is claimed is:

1. An array substrate, wherein the array substrate comprises:
   a substrate,
   a gate insulating layer, a touch control element and a first conducting wire disposed on the substrate; wherein the touch control element is insulated from the first conducting wire; the first conducting wire comprises an extension section extending beyond the substrate, and the free end of the extension section is a first end;
   an insulating interlayer covering the gate insulating layer, the touch control element and the first conducting wire, and a protective wire arranged along the surface periphery of the insulating interlayer; wherein the protective wire is electrically connected with the first end through a via-hole penetrating the insulating interlayer;
   a planarization layer covering the insulating interlayer and the protective wire, and a second conducting wire disposed on the surface of the planarization layer; wherein the second conducting wire comprises a second end and a third end arranged oppositely and a contact position between the second end and the third end; the second end is electrically connected with the touch control element through a via-hole, and the contact position is electrically connected with a portion of the first conducting wire located in the substrate through a via-hole.

2. The array substrate as claimed in claim 1, wherein the second conducting wire comprises a first portion arranged around a portion of the touch control element, and the second end is a free end of the first portion.

3. The array substrate as claimed in claim 2, wherein the contact position is located in the first portion and the first portion is electrically connected with the first conducting wire in the substrate after going around to a side of the touch control element.

4. The array substrate as claimed in claim 1, wherein the first conducting wire comprises a second portion arranged around a portion of the touch control element, and the second portion is electrically connected with the contact position of the second conducting wire after going around to a side of the touch control element.

5. The array substrate as claimed in claim 1, wherein the protective wire is enclosed along the surface periphery of the insulating interlayer to form a protective area; a portion of the first conducting wire, the touch control element and the second conducting wire are located in the protective area, and the extension section of the first conducting wire extends beyond the protective area.

6. The array substrate as claimed in claim 5, wherein the protective area is provided with a chip attaching area used to attach chips, and the chips are electrically connected with the third end of the second conducting wire.

7. The array substrate as claimed in claim 1, wherein the second conducting wire and the touch control element are made of polysilicon.

8. The array substrate as claimed in claim 1, wherein the touch control element comprises a source and a drain; the source and the drain are disposed in the same layer with the protective wire and are insulated from the protective wire.

9. A manufacturing method of a display panel, wherein the manufacturing method comprises:
   providing an array substrate as claimed in claim 1 and a color film substrate;
   aligning the array substrate with the color film substrate;
   cutting the array substrate along the periphery of the substrate and removing the extension section of the first conducting wire extending beyond the substrate to obtain a display panel.

10. A display panel comprising an array substrate and a color film substrate, the array substrate comprising:
    a substrate,
    a gate insulating layer, a touch control element and a first conducting wire disposed on the substrate; wherein the touch control element is insulated from the first conducting wire; the first conducting wire comprises an extension section extending beyond the substrate, and the free end of the extension section is a first end;
    an insulating interlayer covering the gate insulating layer, the touch control element and the first conducting wire, and a protective wire arranged along the surface periphery of the insulating interlayer; wherein the protective wire is electrically connected with the first end through a via-hole penetrating the insulating interlayer;
    a planarization layer covering the insulating interlayer and the protective wire, and a second conducting wire disposed on the surface of the planarization layer; wherein the second conducting wire comprises a second end and a third end arranged oppositely and a contact position between the second end and the third end; the second end is electrically connected with the touch control element through a via-hole, and the contact position is electrically connected with a portion of the first conducting wire located in the substrate through a via-hole;
    and wherein the first conducting wire is insulated from second conducting wire.

11. The display panel as claimed in claim 10, wherein the second conducting wire comprises a first portion arranged around a portion of the touch control element, and the second end is a free end of the first portion.

12. The display panel as claimed in claim 11, wherein the contact position is located in the first portion and the first portion is electrically connected with the first conducting wire in the substrate after going around to a side of the touch control element.

13. The display panel as claimed in claim 10, wherein the first conducting wire comprises a second portion arranged around a portion of the touch control element, and the second portion is electrically connected with the contact position of the second conducting wire after going around to a side of the touch control element.

14. The display panel as claimed in claim 10, wherein the protective wire is enclosed along the surface periphery of the insulating interlayer to form a protective area; a portion of the first conducting wire, the touch control element and the second conducting wire are located in the protective area; and the extension section of the first conducting wire extends beyond the protective area.

15. The display panel as claimed in claim 14, wherein the protective area is provided with a chip attaching area used to attach chips, and the chips are electrically connected with the third end of the second conducting wire.

16. The display panel as claimed in claim 10, wherein the second conducting wire and the touch control element are made of polysilicon.

17. The display panel as claimed in claim 10, wherein the touch control element comprises a source and a drain; the source and the drain are disposed in the same layer with the protective wire and are insulated from the protective wire.

* * * * *